(12) United States Patent
Nishikawa

(10) Patent No.: US 12,720,683 B2
(45) Date of Patent: Aug. 25, 2026

(54) DISPLAY MODULE, METHOD OF MANUFACTURING THE SAME, AND ELECTRONIC DEVICE

(71) Applicant: SONY SEMICONDUCTOR SOLUTIONS CORPORATION, Kanagawa (JP)

(72) Inventor: Hiroshi Nishikawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 432 days.

(21) Appl. No.: 18/264,096

(22) PCT Filed: Feb. 10, 2022

(86) PCT No.: PCT/JP2022/005365

§ 371 (c)(1),
(2) Date: Aug. 3, 2023

(87) PCT Pub. No.: WO2022/176772

PCT Pub. Date: Aug. 25, 2022

(65) Prior Publication Data

US 2024/0107843 A1 Mar. 28, 2024

(30) Foreign Application Priority Data

Feb. 18, 2021 (JP) ................................ 2021-024508

(51) Int. Cl.
*H10K 59/131* (2023.01)
*G02F 1/1345* (2006.01)
(Continued)

(52) U.S. Cl.
CPC ......... *H05K 1/189* (2013.01); *G02F 1/13452* (2013.01); *G02F 1/136295* (2021.01);
(Continued)

(58) Field of Classification Search
CPC ......... H05K 1/189; H05K 2201/10136; H10K 77/111; H10K 59/1315; H10K 59/82;
(Continued)

(56) References Cited

U.S. PATENT DOCUMENTS 6,659,795 B1 * 12/2003 Lai ....................... H05K 7/1061 439/526
2006/0214272 A1 * 9/2006 Seki .................... H10W 70/457 257/E23.054
(Continued)

FOREIGN PATENT DOCUMENTS

JP 2002373779 A * 12/2002 ............. B23K 20/10
JP 2003-086363 A 3/2003
(Continued)

OTHER PUBLICATIONS

Machine translation, Kayama, Japanese Pat. Pub. No. JP2002373779A, translation date: Dec. 10, 2025, Espacenet, all pages. (Year: 2025).*
(Continued)

*Primary Examiner* — Victoria K. Hall
(74) *Attorney, Agent, or Firm* — CHIP LAW GROUP

(57) ABSTRACT

Provided is a display module capable of reducing connection resistance between a mounting board and a display.
A display module includes a mounting board provided with a bump, and a display mounted on the mounting board and provided with a connection terminal bonded to the bump by solid-phase diffusion bonding.

12 Claims, 6 Drawing Sheets

(51) Int. Cl.

| | |
|---|---|
| ***G02F 1/1362*** | (2006.01) |
| ***G09F 9/00*** | (2006.01) |
| ***G09F 9/30*** | (2006.01) |
| ***G09F 9/33*** | (2006.01) |
| ***H01L 33/48*** | (2010.01) |
| ***H01L 33/62*** | (2010.01) |
| ***H05B 33/06*** | (2006.01) |
| ***H05B 33/10*** | (2006.01) |
| ***H05K 1/18*** | (2026.01) |
| ***H05K 1/189*** | (2026.01) |
| ***H10H 20/85*** | (2025.01) |
| ***H10H 20/857*** | (2025.01) |
| ***H10K 59/12*** | (2023.01) |
| ***H10K 59/82*** | (2023.01) |
| *H10H 20/01* | (2025.01) |

(52) U.S. Cl.
CPC .................. *G09F 9/00* (2013.01); *G09F 9/30* (2013.01); *G09F 9/33* (2013.01); *H05B 33/06* (2013.01); *H05B 33/10* (2013.01); *H10H 20/8506* (2025.01); *H10H 20/857* (2025.01); *H10K 59/1201* (2023.02); *H10K 59/1315* (2023.02); *H10K 59/82* (2023.02); *H05K 2201/10136* (2013.01); *H10H 20/0364* (2025.01)

(58) Field of Classification Search
CPC .............. H10H 20/857; H10H 20/0364; H01L 23/3157–3192
See application file for complete search history.

(56) References Cited

U.S. PATENT DOCUMENTS

| | | | | |
|---|---|---|---|---|
| 2007/0015300 | A1* | 1/2007 | Liu | H10H 20/857 438/615 |
| 2015/0014709 | A1* | 1/2015 | Kim | G02F 1/136286 438/29 |
| 2015/0331508 | A1* | 11/2015 | Nho | G06F 3/0443 345/173 |
| 2017/0365653 | A1* | 12/2017 | Kim | H05K 1/111 |
| 2020/0203382 | A1* | 6/2020 | Jung | G09G 3/3266 |
| 2020/0312940 | A1 | 10/2020 | Jang | |

FOREIGN PATENT DOCUMENTS

| | | | | |
|---|---|---|---|---|
| JP | 2008-165219 | A | 7/2008 | |
| JP | 2009-152643 | A | 7/2009 | |
| WO | WO2006006817 | A1 * | 1/2006 | H01L 23/544 |

OTHER PUBLICATIONS

International Search Report and Written Opinion of PCT Application No. PCT/JP2022/005365, issued on Apr. 5, 2022, 09 pages of ISRWO.

* cited by examiner

FIG. 5A
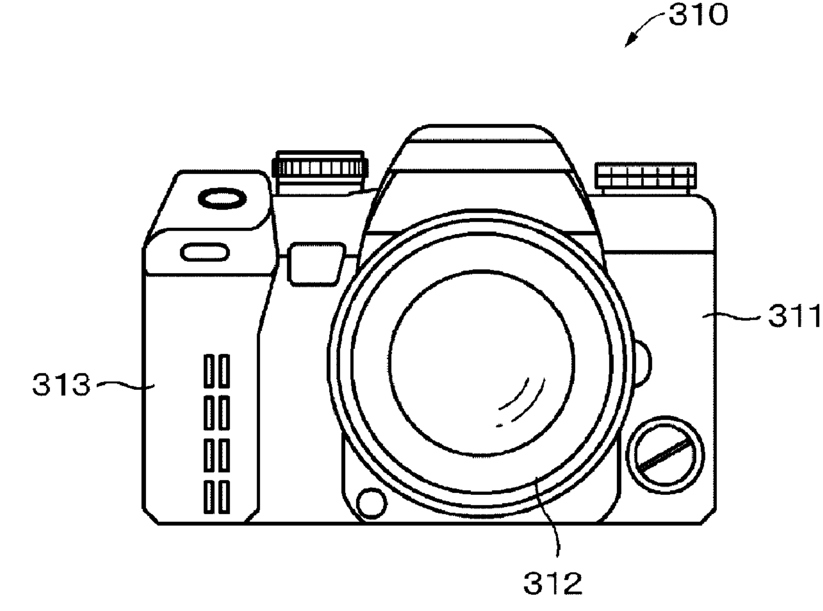
FIG. 5B
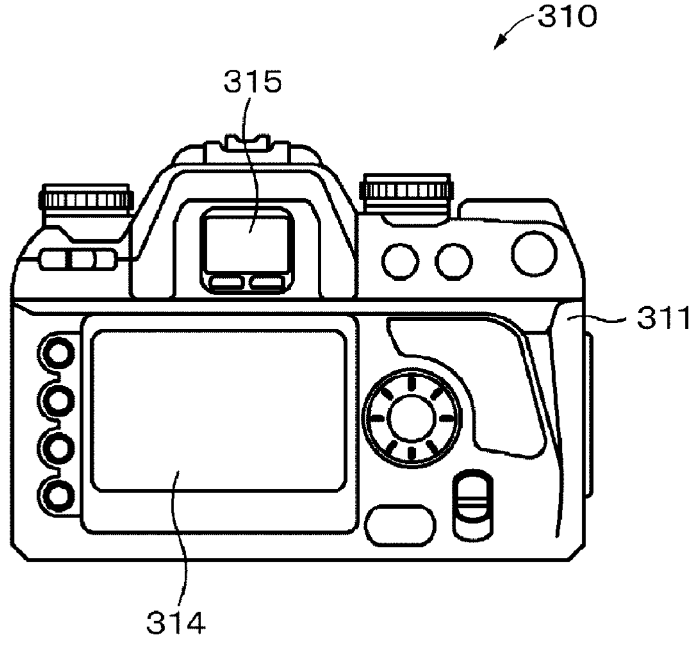

DISPLAY MODULE, METHOD OF MANUFACTURING THE SAME, AND ELECTRONIC DEVICE

CROSS REFERENCE TO RELATED APPLICATIONS

This application is a U.S. National Phase of International Patent Application No. PCT/JP2022/005365 filed on Feb. 10, 2022, which claims priority benefit of Japanese Patent Application No. JP 2021-024508 filed in the Japan Patent Office on Feb. 18, 2021. Each of the above-referenced applications is hereby incorporated herein by reference in its entirety.

TECHNICAL FIELD

The present disclosure relates to a display module, a method of manufacturing the same, and an electronic device provided with the same.

BACKGROUND ART

In recent years, display modules have been used in various electronic devices. As the display module, a module obtained by mounting a display on a mounting board (for example, a flexible printed circuit board) is widely known.

As a technology of electrically bonding connection terminals between a mounting board and a display, a technology using an anisotropic conductive film (ACF) has been proposed (refer to, for example, Patent Document 1). ACF is a material in which conductive particles are dispersed in an adhesive that sandwiches the conductive particles in a gap between connection terminals by thermocompression bonding to form a conductive path.

CITATION LIST

Patent Document

Patent Document 1: Japanese Patent Application Laid-Open No. 2009-152643

SUMMARY OF THE INVENTION

Problems to be Solved by the Invention

However, in the anisotropic conductive film, since the connection terminals are electrically connected by sandwiching the conductive particles between the connection terminals by thermocompression bonding, a connection resistance per terminal is high, for example, one ohm or more.

An object of the present disclosure is to provide a display module capable of reducing connection resistance between a mounting board and a display, a method of manufacturing the same, and an electronic device provided with the same.

Solutions to Problems

In order to solve the problem described above, a first disclosure is a display module including:

a mounting board provided with a bump; and a display mounted on the mounting board and provided with a connection terminal bonded to the bump by solid-phase diffusion bonding.

A second disclosure is an electronic device including the display module according to the first disclosure.

A third disclosure is a method of manufacturing a display module, the method including: bonding a bump of a mounting board and a connection terminal of a display by solid-phase diffusion bonding at 100° C. or lower.

BRIEF DESCRIPTION OF DRAWINGS

FIG. 3 is a cross-sectional view illustrating an example of a configuration of a display module according to a variation.

FIG. 5A is a front view illustrating an example of an external appearance of a digital still camera. FIG. 5B is a rear view illustrating an example of an external appearance of the digital still camera.

MODE FOR CARRYING OUT THE INVENTION

Figure 1:
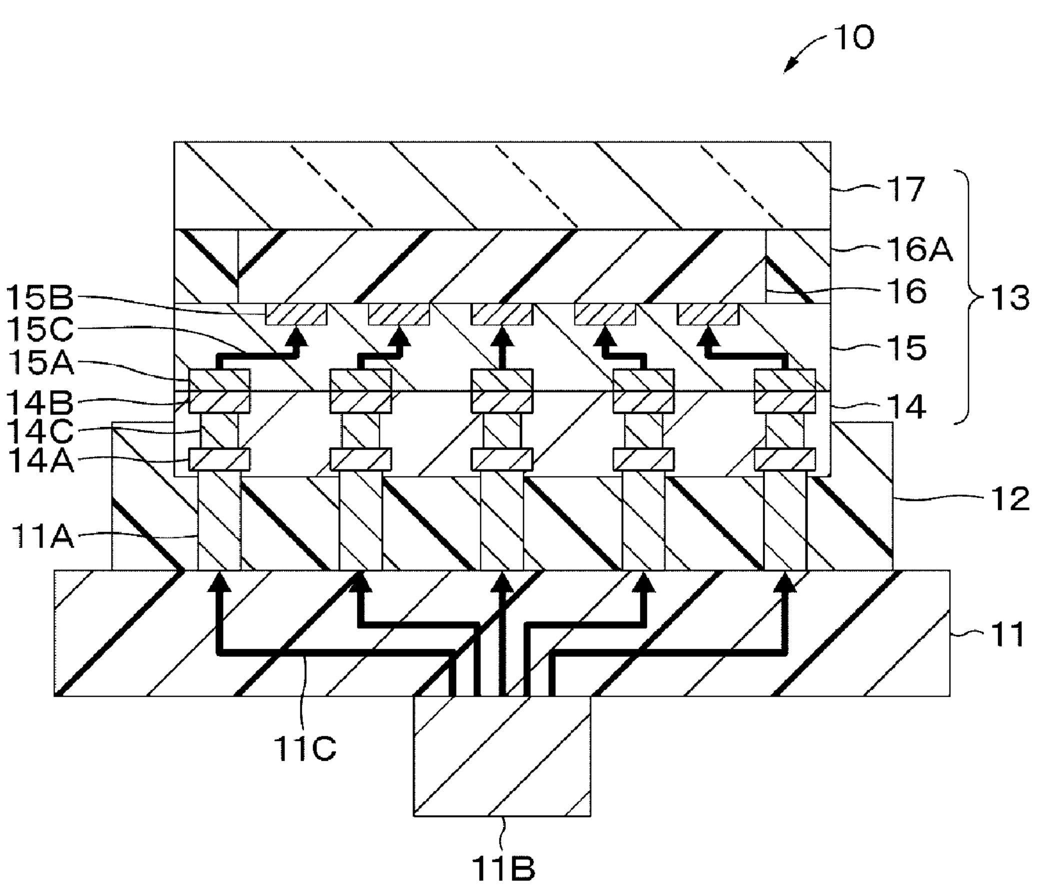
FIG. 1 is a cross-sectional view illustrating an example of a configuration of a display module according to one embodiment of the present disclosure.

Embodiments of the present disclosure will be described in the following order with reference to the drawings. Note that, in all the drawings of the following embodiments, the same or corresponding parts are denoted by the same reference numerals.

1 One Embodiment (Example of Display Device)

2 Variation (Variation of Display Device)

3 Application Example (Example of Electronic Device)

1 One Embodiment

[Configuration of Display Module]

FIG. 1 is a cross-sectional view illustrating an example of a configuration of a display module 10 according to one embodiment of the present disclosure. The display module 10 is provided with a mounting board 11, an underfill material 12, and a display 13.

(Mounting Board)

The mounting board 11 on one surface of which the display 13 is mounted connects the display 13 to another component such as a main board. The mounting board 11 is, for example, a printed circuit board. The printed circuit board is, for example, a rigid board. The printed circuit board may also be a multilayer printed circuit board.

The mounting board 11 is provided with a plurality of bumps 11A, a connector 11B, and a plurality of vias 11C. The plurality of bumps 11A is electrically bonded to a plurality of pads 14A of the display 13, respectively. The plurality of bumps 11A is provided on one surface of the mounting board 11 on which the display 13 is mounted. The bump 11A or a surface thereof preferably includes a material capable of being bonded by solid-phase diffusion bonding to the pad 14A of the display 13 at low temperature of 100° C. or lower. The bump 11A or the surface thereof contains, for example, at least one selected out of a group including gold (Au), aluminum (Al), and copper (Cu). Specifically, for example, the bump 11A or the surface thereof may include gold (Au), a gold alloy (Au alloy), aluminum (Al), an aluminum alloy (Al alloy), copper (Cu), or a copper alloy (Cu alloy).

The connector 11B is a connection terminal for connecting the display module 10 to another component such as the main board. The connector 11B is provided on the other surface of the mounting board 11. Here, one surface of the mounting board 11 is a surface on a side on which the display 13 is mounted, and the other surface of the mounting board 11 is a surface on a side opposite to the side on which the display 13 is mounted.

The plurality of vias 11C is provided in the mounting board 11. The via 11C electrically connects the connector 11B to the bump 11A. The plurality of vias 11C includes metal such as copper (Cu) or silver (Ag), for example.

(Underfill Material)

The underfill material 12 is provided in a gap between the mounting board 11 and the display 13, and is an adhesive for bonding the mounting board 11 and the display 13. The underfill material 12 covers a periphery of each bump 11A.

(Display)

The display 13 displays an image on the basis of an image signal transmitted from the main board and the like via the mounting board 11. The display 13 is mounted on one surface of the mounting board 11. The display 13 may be a microdisplay of a size of one inch or smaller. The display 13 is provided with a logic board 14 and a pixel board 15. The display 13 may further be provided with a sealing resin 16, an adhesive 16A, and a cover glass 17 as necessary.

(Logic Board)

The logic board 14 is provided on one surface of the mounting board 11. The logic board 14 is an example of a first board. The logic board 14 is provided with a first semiconductor substrate (not illustrated), a drive circuit (not illustrated), a plurality of pads 14A, a plurality of pads 14B, and a plurality of vias 14C. The logic board 14 may be a display driver integrated circuit (DDIC). The pads 14A and 14B are examples of connection terminals.

The first semiconductor substrate is, for example, a silicon substrate. The silicon substrate includes, for example, amorphous silicon, polycrystalline silicon, single crystal silicon or the like. The drive circuit is provided on one surface of the first semiconductor substrate. The drive circuit controls lighting, luminance and the like of a display element on the basis of a signal transmitted from the main board and the like via the mounting board 11. One surface of the first semiconductor substrate is a surface on the pixel board 15 side, and the other surface of the first semiconductor substrate is a surface on the mounting board 11 side.

The plurality of pads 14A is provided on the other surface of the first semiconductor substrate. The plurality of pads 14A is electrically bonded to the plurality of bumps 11A of the mounting board 11, respectively. Bonding between the pad 14A and the bump 11A of the mounting board 11 is solid-phase diffusion bonding. As the solid-phase diffusion bonding, for example, ultrasonic bonding may be used. The solid-phase diffusion bonding is preferably low-temperature solid-phase diffusion bonding. When bonding between the mounting board 11 and the display 13 is low-temperature solid-phase diffusion bonding, a thermal damage to the display 13 may be suppressed when the mounting board 11 and the display 13 are bonded. Therefore, as the display element, an organic electroluminescence (EL) element, a liquid crystal display element and the like having low heat-resistant temperature may be used. Temperature of the low-temperature solid-phase diffusion bonding is preferably 100° C. or lower from the viewpoint of suppressing the thermal damage to the display 13.

The bump 11A or the surface thereof preferably includes a material capable of being bonded by solid-phase diffusion bonding to the bump 11A of the mounting board 11 at low temperature of 100° C. or lower. The pad 14A or a surface thereof contains, for example, at least one selected out of a group including aluminum (Al) and gold (Au). Specifically, for example, the pad 14A or the surface thereof may include aluminum (Al), an aluminum alloy (Al alloy), gold (Au), or a gold alloy. Examples of the aluminum alloy include aluminum copper (AlCu), aluminum molybdenum (AlMo), aluminum silicon (AlSi) or the like, for example. Gold (Au) plating may be provided on the surface of the pad 14A. Examples of the gold plating include gold/palladium/nickel (Au/Pd/Ni), gold/nickel (Au/Ni) or the like.

The fact that the bonding between the pad 14A and the bump 11A is the solid-phase diffusion bonding may be determined, for example, by obtaining a cross-sectional scanning electron microscope (SEM) image or a cross-sectional transmission electron microscope (TEM) image of the display module 10 and checking a state of a bonding interface between the pad 14A and the bump 11A (for example, distribution of an alloy phase at the interface and the like).

The plurality of pads 14B is provided on one surface of the first semiconductor substrate. The plurality of pads 14B is electrically bonded to a plurality of pads 15A of the pixel board 15, respectively. The pad 14A includes, for example, copper (Cu).

The plurality of vias 14C is provided in the first semiconductor substrate. The via 14C electrically connects the pad 14A to the pad 14B. The via 14C includes metal such as copper (Cu) or tungsten (W), for example.

(Pixel Board)

The pixel board 15 is provided on one surface of the logic board 14. The pixel board 15 is an example of a second board. The pixel board 15 is provided with a second semiconductor substrate, a display element, and a pixel circuit (none is illustrated).

The second semiconductor substrate is, for example, a silicon substrate. The silicon substrate includes, for example, amorphous silicon, polycrystalline silicon, single crystal silicon or the like.

The display element is provided on one surface of the second semiconductor substrate. The display element is, for example, an organic electroluminescence (EL) element, a liquid crystal display element, or a micro light emitting diode (LED) element. One surface of the second semiconductor substrate is a surface on a side of a display surface of the display 13, and the other surface of the second semiconductor substrate is a surface on the logic board 14 side.

The pixel circuit connects the display element to the logic board 14. The pixel circuit is provided with a plurality of pads 15A, a plurality of pads 15B, and a plurality of vias 15C. The pads 15A and 15B are examples of connection terminals.

The plurality of pads 15A is provided on the other surface of the second semiconductor substrate. The plurality of pads 15A is electrically bonded to the plurality of pads 14B of the logic board 14, respectively. The pad 15A includes, for example, copper (Cu).

Bonding between the first semiconductor substrate and the second semiconductor substrate is preferably direct bonding from the viewpoint of reducing contact resistance. More specifically, bonding between the pad 15A of the pixel board 15 and the pad 14B of the logic board 14 is preferably direct bonding from the viewpoint of reducing contact resistance. Examples of the direct bonding include diffusion bonding, normal-temperature bonding, anodic bonding, reaction bonding or the like, for example. The direct bonding is preferably Cu—Cu bonding. Here, the Cu—Cu bonding refers to bonding in which the pad 15A including copper (Cu) and the pad 14B including copper (Cu) are directly bonded.

The plurality of pads 15B is provided on one surface of the second semiconductor substrate. The plurality of pads 15B is electrically connected to the display element. The pad 15B includes, for example, copper (Cu).

The plurality of vias 15C is provided in the second semiconductor substrate. The via 15C electrically connects the pad 15A to the pad 15B. The via 15C includes metal such as copper (Cu) or tungsten (W), for example.

(Adhesive)

The adhesive 16A adheres the pixel board 15 to the cover glass 17. The adhesive 16A is provided between peripheries of facing surfaces of the pixel board 15 and the cover glass 17. The adhesive 16A has, for example, a closed loop shape.

(Sealing Resin)

The sealing resin 16 seals the display element. The sealing resin 16 fills a space between the pixel board 15 and the cover glass 17. The sealing resin 16 is provided inside the adhesive 16A. The sealing resin 16 contains, for example, at least one selected out of a group including a thermosetting resin, an ultraviolet curable resin and the like.

(Cover Glass)

The cover glass 17 protects the display element. The cover glass 17 is a so-called counter substrate, and is provided to face one surface of the pixel board 15. The cover glass 17 has transparency with respect to each color light emitted from the display element.

[Method of Manufacturing Display Module]

Next, an example of a method of manufacturing the display module 10 according to one embodiment of the present disclosure is described.

First, the logic board 14 and the second semiconductor substrate for forming the pixel board are directly bonded. At that time, the plurality of pads 14B of the logic board 14 is directly bonded to the plurality of pads 15A of the second semiconductor substrate. Bonding between the pad 14B and the pad 15A is preferably Cu—Cu bonding.

Next, the display element is formed on one surface of the second semiconductor substrate. Therefore, the pixel board 15 is formed on one surface of the logic board 14. Next, after the adhesive 16A and the sealing resin 16 are sequentially applied to one surface of the pixel board 15, the cover glass 17 is placed on the adhesive 16A and the sealing resin 16, the adhesive 16A and the sealing resin 16 are cured, and the cover glass 17 is adhered onto the display element. Therefore, the display 13 is obtained.

Next, after the display 13 is placed on one surface of the mounting board 11, the plurality of bumps 11A of the mounting board 11 is directly bonded to the plurality of pads 14A of the display panel, respectively, by solid-phase diffusion bonding such as ultrasonic bonding. The solid-phase diffusion bonding is preferably low-temperature solid-phase diffusion bonding at 100° C. or lower. Next, the underfill material 12 fills the gap between the mounting board 11 and the display 13 and be cured. As described above, a target display module 10 is obtained.

[Action and Effect]

As described above, in the display module 10 according to one embodiment, the plurality of bumps 11A of the mounting board 11 and the plurality of pads 14A of the display 13 (specifically, the logic board 14) are bonded by solid-phase diffusion bonding. Therefore, connection resistance may be reduced as compared with a case where the plurality of bumps 11A of the mounting board 11 is connected to the plurality of pads 14A of the display 13 (specifically, the logic board 14) by an anisotropic conductive film (ACF).

Since the connection resistance may be reduced as described above, parasitic capacitance may be reduced even if the bump 11A and the pad 14A are made small. Therefore, this may support high-speed transmission.

Since the display 13 is stacked on the mounting board 11, the display module 10 may be downsized.

Since the plurality of bumps 11A and the plurality of pads 14A are directly bonded on a back surface side of the display 13, an area of connection may be reduced as compared with a case where the mounting board 11 is connected to the display 13 by wire bonding (wedge bonding) and the like.

Since the plurality of bumps 11A and the plurality of pads 14A are directly bonded on the back surface side of the display 13, rewiring may be performed using a mounting area of the display 13 on the mounting board 11. Therefore, a degree of freedom in rewiring layout may be improved. Furthermore, a wiring route may be shortened. Furthermore, the display 13 (for example, the logic board 14) may be provided with an application processor and the like in addition to the drive circuit. In this case, it is possible to further enhance a function of the display 13.

Since the display 13 is mounted on the plurality of bumps 11A of the mounting board 11, a filling property of the underfill material 12 with respect to the gap between the mounting board 11 and the display 13 may be easily adjusted by adjusting heights of the plurality of bumps 11A.

In the method of manufacturing the display module 10 according to one embodiment, the plurality of bumps 11A of the mounting board 11 and the pads 14A of the display 13 (specifically, the logic board 14) are bonded by solid-phase diffusion bonding at low temperature of 100° C. or lower. Therefore, when the plurality of bumps 11A of the mounting board 11 and the pads 14A of the display 13 are directly bonded, thermal damage to the display element may be suppressed. Furthermore, the plurality of bumps 11A of the mounting board 11 and the pads 14A of the display 13 may be collectively bonded.

In the method of manufacturing the display module 10 according to one embodiment, after the logic board 14 and the second semiconductor substrate for forming the pixel board are bonded, the display element is formed on one surface of the second semiconductor substrate, and the cover glass 17 is adhered onto the display element. Therefore, it is possible to prevent the display element from deteriorating due to heat at the time of bonding (for example, at the time of Cu—Cu bonding) between the logic board 14 and the second semiconductor substrate for forming the pixel board.

As a method of bonding between the plurality of bumps 11A of the mounting board 11 and the pads 14A of the display 13, a bonding method using solder may be considered. However, in the bonding method using solder, since the bonding is performed in a heating atmosphere in a reflow furnace (heating furnace) and the like, stress accumulation due to heat, warpage, peeling failure of the adhered portion and the like might occur.

In contrast, in the method of manufacturing the display module 10 according to one embodiment, since the plurality of bumps 11A of the mounting board 11 and the pads 14A of the display 13 may be bonded in a room temperature atmosphere, stress accumulation due to heat is less than that in bonding by solder, and occurrence of warpage, peeling failure of the adhered portion and the like may be suppressed.

2 Variation (Variation 1)

Figure 2:
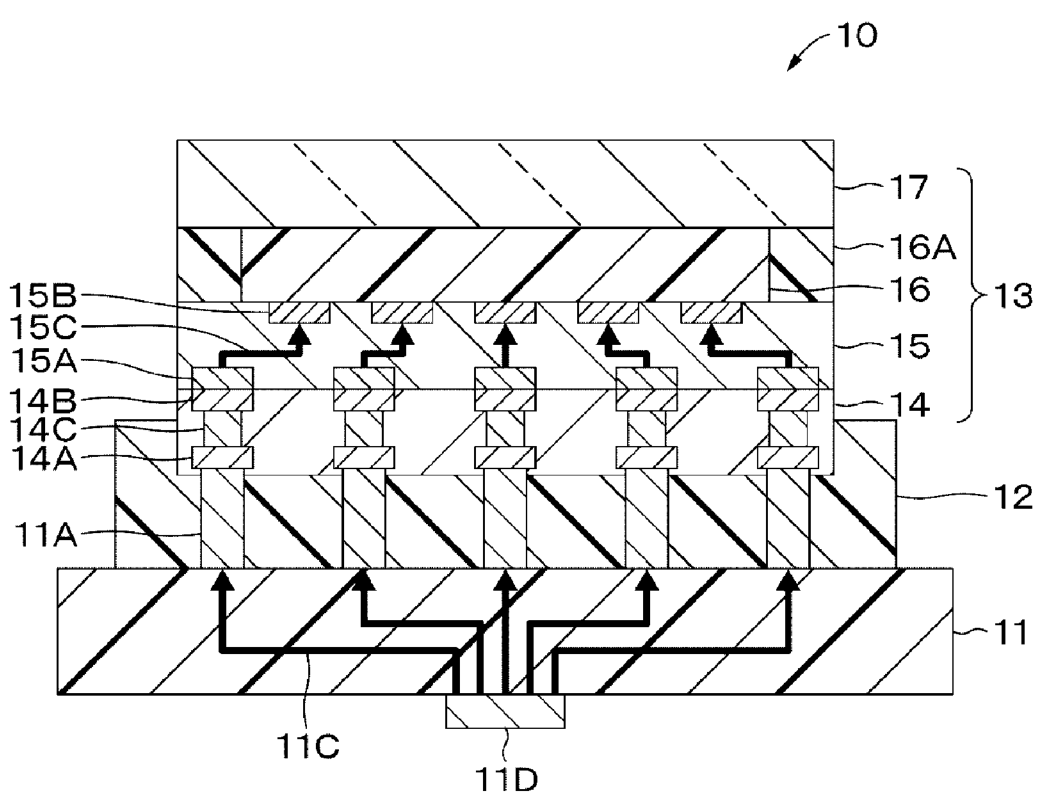
FIG. 2 is a cross-sectional view illustrating an example of a configuration of a display module according to a variation.

In one embodiment described above, the example in which the mounting board 11 is provided with the connector 11B (refer to FIG. 1) has been described, but the mounting board 11 may be provided with a land grid array (LGA) 11D instead of the connector 11B as illustrated in FIG. 2. The LGA 11D is a connection terminal for connecting the display module 10 to another component such as the main board. The LGA 11D is provided on the other surface of the mounting board 11.

Variation 2

Figure 3:
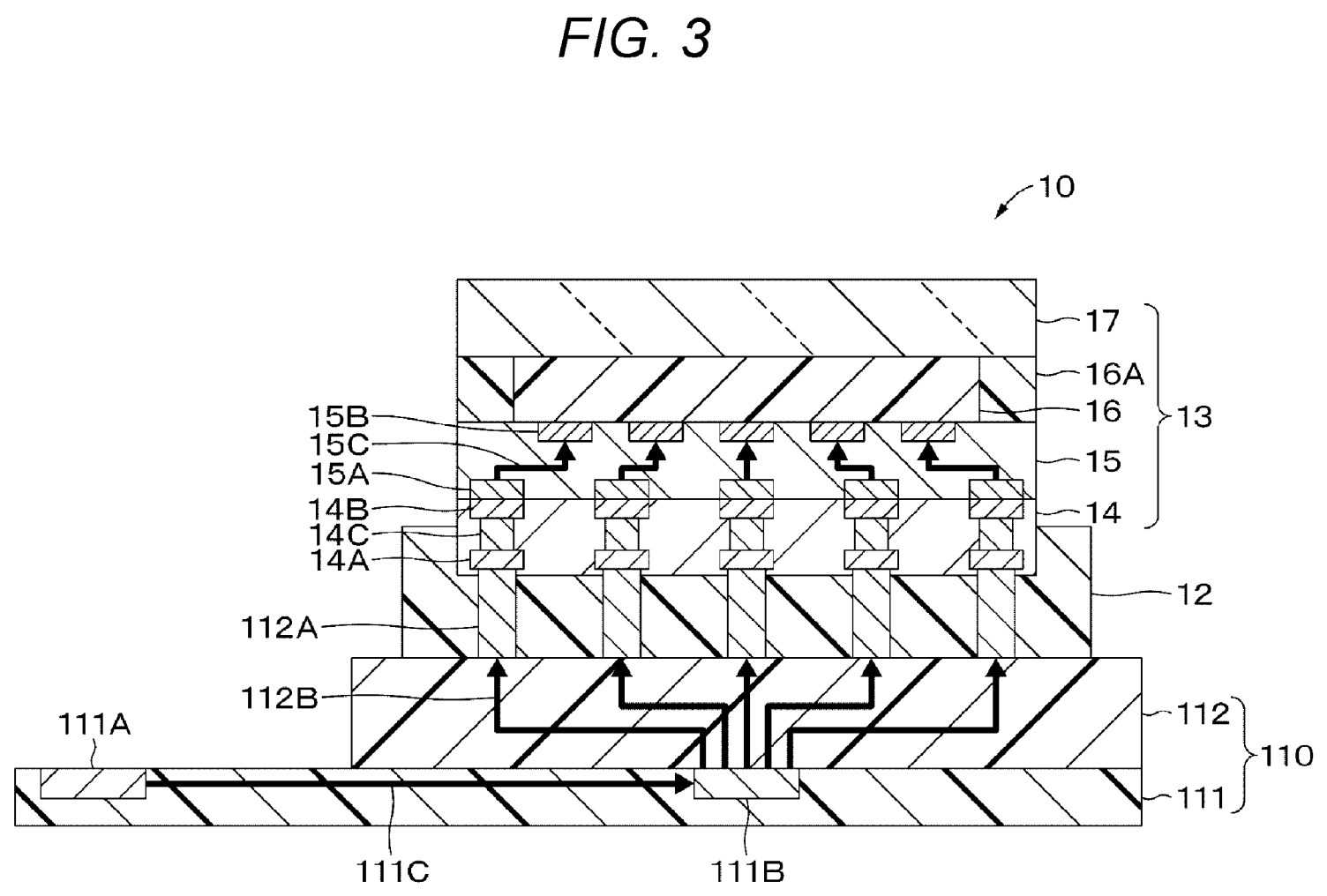

In one embodiment described above, the example in which the display module 10 is provided with the mounting board 11, which is the rigid board, has been described (refer to FIG. 1), but the display module 10 may be provided with a mounting board 110, which is a rigid flexible printed circuit board, as illustrated in FIG. 3.

The mounting board 110 as the rigid flexible printed circuit board, is provided with a flexible printed circuit board (flexible printed circuits: FPC) 111 and a rigid board 112. The flexible printed circuit board 111 is provided with a plurality of pads 111A, a plurality of pads 111B, and a plurality of pieces of wiring 111C. The flexible printed circuit board 111 has an elongated shape.

The plurality of pads 111A is provided in an area in which the rigid board 112 is not stacked. Specifically, the plurality of pads 111A is provided at one end in a longitudinal direction of one surface of the flexible printed circuit board 111. The plurality of pads 111A is for connecting to another component such as the main board. The pad 111A includes, for example, metal such as copper (Cu).

The plurality of pads 111B is provided in an area in which the rigid board 112 is stacked of one surface of the flexible printed circuit board 111. The plurality of pads 111B is bonded to the plurality of vias 112B of the rigid board 112, respectively. The pad 111B includes, for example, metal such as copper (Cu).

The plurality of pieces of wiring 111C is provided on one surface of the flexible printed circuit board 111 and covered with a coverlay (not illustrated). The plurality of pieces of wiring 111C electrically connects the pads 111A and the pads 111B. The wiring 111C includes, for example, metal such as copper (Cu).

The rigid board 112 is provided on one surface of the flexible printed circuit board 111. The rigid board 112 is provided with a plurality of bumps 112A and a plurality of vias 112B. The bump 112A is similar to the bump 11A in one embodiment described above. The plurality of vias 112B electrically connects the pads 111B and the bumps 112A, respectively. The plurality of vias 112B includes metal such as copper (Cu) or silver (Ag), for example.

Variation 3

Figure 4:
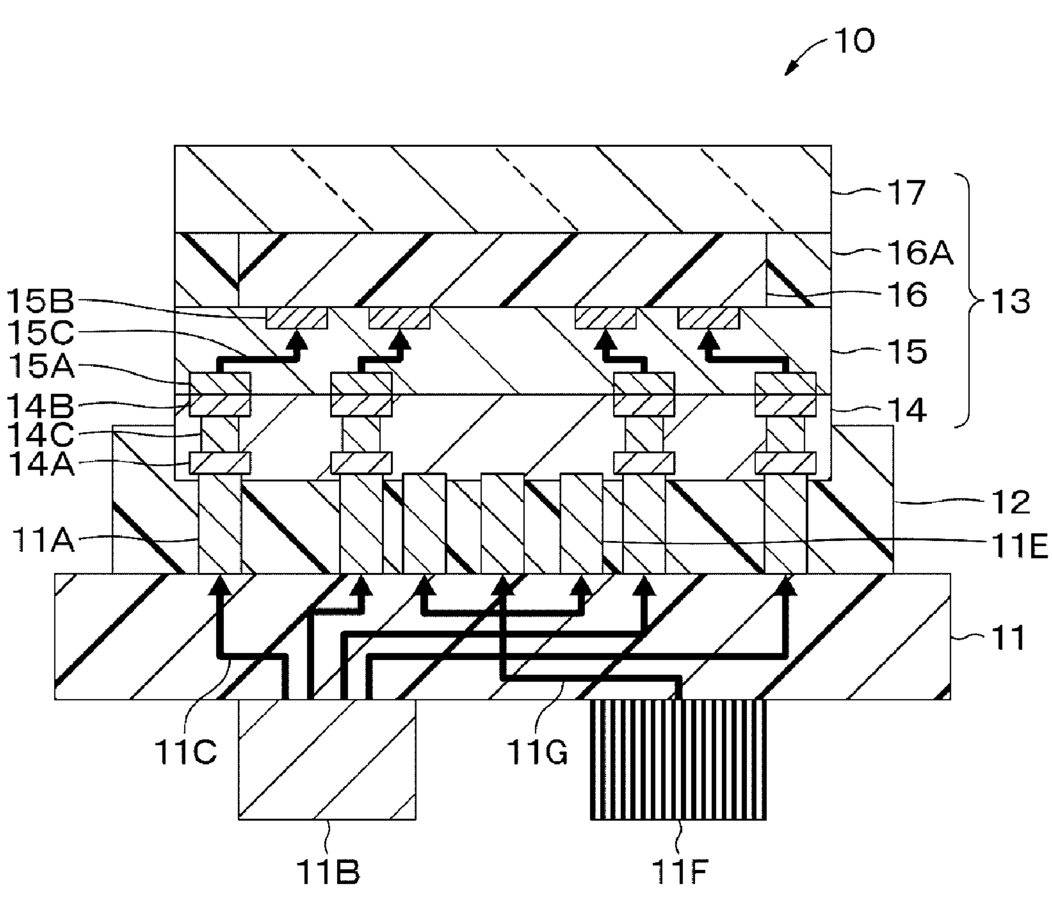
FIG. 4 is a cross-sectional view illustrating an example of a configuration of a display module according to a variation.

As illustrated in FIG. 4, the mounting board 11 may further be provided with a plurality of bumps 11E, a heat sink 11F, and a plurality of thermal vias 11G.

The plurality of bumps 11E is for conducting heat from the display 13 to the mounting board 11. The plurality of bumps 11E is provided on one surface of the mounting board 11 similarly to the plurality of bumps 11A. The plurality of bumps 11E is bonded to the other surface of the display 13 (specifically, the logic board 14). As a material of the bump 11E, a material similar to that of the bump 11A may be exemplified.

Each of the plurality of thermal vias 11G is for conducting heat from the bump 11E to the heat sink 11F. The plurality of thermal vias 11G is provided in the mounting board 11. One ends of the plurality of thermal vias 11G are bonded to the plurality of bumps 11E, respectively, and the other ends of the plurality of thermal vias 11G are bonded to the heat sink 11F. The plurality of vias 11G preferably includes copper (Cu) from the viewpoint of thermal conductivity.

The heat sink 11F is a heat dissipation component that dissipates heat supplied via the plurality of bumps 11E and the plurality of thermal vias 11G to the atmosphere or the like. The heat sink 11F preferably includes metal such as aluminum (Al), iron (Fe), or copper (Cu) from the viewpoint of thermal conductivity.

As described above, since the mounting board 11 is provided with the plurality of bumps 11E, the heat sink 11F, and the plurality of thermal vias 11G, heat dissipation of the display module 10 may be improved.

3 Application Example (Electronic Device)

The display module 10 according to one embodiment and its variation described above may be used for various electronic devices. The display module 10 may be incorporated in various electronic devices. Especially, this is suitable for an electronic viewfinder of a video camera or a single-lens reflex camera, a head mounted display or the like in which high resolution is required, used for enlarging near the eyes.

Specific Example 1

FIGS. 5A and 5B illustrate an example of an external appearance of a digital still camera 310. The digital still camera 310 is of a lens interchangeable single-lens reflex type, and includes an interchangeable imaging lens unit (interchangeable lens) 312 substantially at the center in front of a camera main body (camera body) 311, and a grip 313 to be held by an imager on a front left side.

A monitor 314 is provided at a position shifted to the left from the center of a rear surface of the camera main body 311. An electronic viewfinder (eyepiece window) 315 is provided above the monitor 314. By looking through the electronic viewfinder 315, the photographer may visually confirm a light image of a subject guided from the imaging lens unit 312 and determine a picture composition. As the electronic viewfinder 315, the display module 10 may be used.

Specific Example 2

Figure 6:
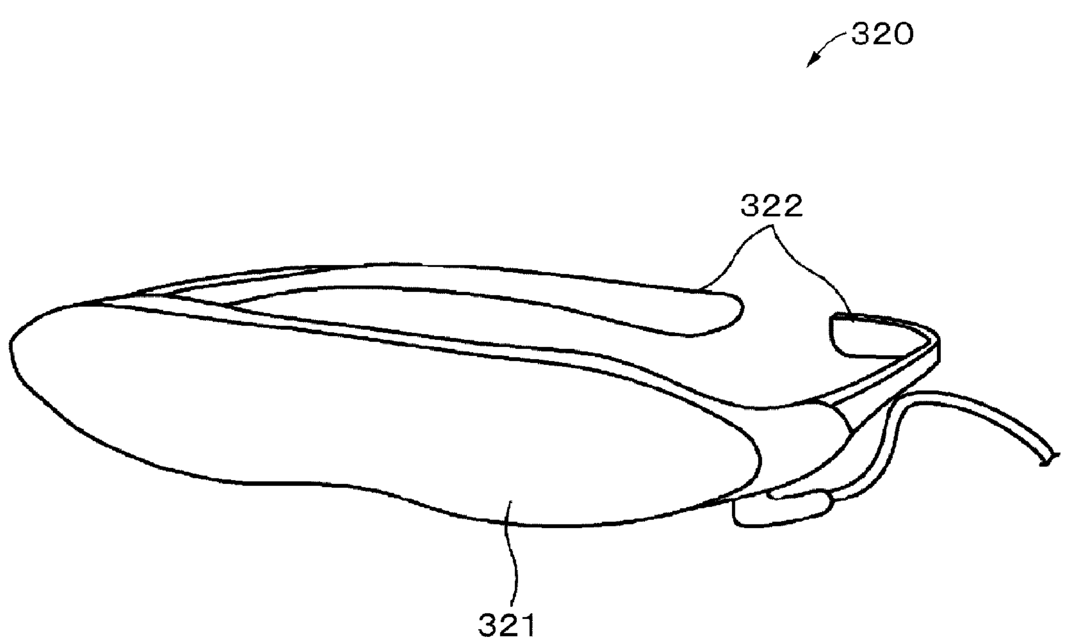
FIG. 6 is a perspective view of an example of an external appearance of a head mounted display.

FIG. 6 illustrates an example of an external appearance of a head mounted display 320. The head mounted display 320 includes, for example, ear hooks 322 to be worn on the head of a user on both sides of a glass-shaped display unit 321. As the display unit 321, the display module 10 may be used.

The embodiments, variations, and application examples of the present disclosure have been specifically described above, but the present disclosure is not limited to the above-described embodiments, variations, and application examples, and various modifications based on the technical idea of the present disclosure are possible.

For example, the configuration, method, step, shape, material, numerical value and the like described in the embodiments, variations, and application examples described above are merely examples, and the configuration, method, step, shape, material, numerical value and the like different from those may also be used as necessary.

Furthermore, configurations, methods, steps, shapes, materials, numerical values and the like of the above-described embodiments, variations, and application examples thereof may be combined with each other without departing from the gist of the present disclosure.

Furthermore, the materials exemplified in the above-described embodiments may be used alone or in combination of two or more unless otherwise specified.

Furthermore, the present disclosure may also employ the following configurations.

(1)

A display module including:

a mounting board provided with a bump; and a display mounted on the mounting board and provided with a connection terminal bonded to the bump by solid-phase diffusion bonding.

(2)

The display module according to (1), in which a surface of the bump and a surface of the connection terminal include a material capable of being bonded by solid-phase diffusion bonding at 100° C. or lower.

(3)

The display module according to (1) or (2), in which a surface of the bump contains at least one selected out of a group including gold, aluminum, and copper, and a surface of the connection terminal contains at least one selected out of a group including aluminum and gold.

(4)

The display module according to any one of (1) to (3), in which the display is provided with a first board provided on the mounting board, and a second board provided on the first board, the first board is provided with a first semiconductor substrate, and a drive circuit provided on the first semiconductor substrate, and the second board is provided with a second semiconductor substrate, and a display element provided on the second semiconductor substrate.

(5)

The display module according to (4), in which the display element is an organic EL element, a liquid crystal display element, or an LED element.

(6)

The display module according to (4) or (5), in which the first semiconductor substrate and the second semiconductor substrate are directly bonded.

(7)

The display module according to any one of (4) to (6), in which the first board is provided with a first connection terminal including copper, the second board is provided with a second connection terminal including copper, and the first connection terminal and the second connection terminal are directly bonded.

(8)

The display module according to any one of (1) to (7), in which the mounting board is provided with a connector, and the connector is provided on a surface on a side opposite to a side of the display.

(9)

The display module according to any one of (1) to (7), in which the mounting board is provided with a land grid array (LGA), and the LGA is provided on a surface on a side opposite to the display.

(10)

The display module according to any one of (1) to (9), in which the mounting board is a printed circuit board.

(11)

The display module according to any one of (1) to (9), in which the mounting board is a rigid flexible printed circuit board.

(12)

The display module according to any one of (1) to (11), further including:

an underfill, in which the underfill is provided between the mounting board and the display.

(13)

An electronic device including:

the display module according to any one of (1) to (12).

(14)

A method of manufacturing a display module, the method including:

bonding a bump of a mounting board and a connection terminal of a display by solid-phase diffusion bonding at 100° C. or lower.

(15)

The method of manufacturing a display module according to (14), further including:

filling a space between the mounting board and the display with an underfill material after the solid-phase diffusion bonding.

(16)

The method of manufacturing a display module according to (14) or (15), further including:

bonding a first semiconductor substrate and a second semiconductor substrate;

forming a display element on the second semiconductor substrate; and adhering a cover glass onto the display element, before the solid-phase diffusion bonding.

REFERENCE SIGNS LIST

10 Display module
11 Mounting board
11A, 11E Bump
11B Connector
11C Via
11D LGA
11F Heat sink
11G Thermal via
12 Underfill
13 Display
14 Logic board
14A, 14B Pad
14C Via
15 Pixel board
15A, 15B Pad
15C Via

16 Sealing resin
16A Adhesive
17 Cover glass
310 Digital still camera (electronic device)
320 Head mounted display (electronic device)

The invention claimed is:

1. A display module, comprising:
a mounting board with a bump; and
a display mounted on the mounting board, wherein
the display is provided with a connection terminal bonded to the bump by solid-phase diffusion bonding,
a surface of the bump contains gold, and
a surface of the connection terminal includes at least one of aluminium or gold and further includes a gold plating that comprises gold/palladium/nickel.

2. The display module according to claim 1, wherein
a surface of the bump and a surface of the connection terminal include a material capable of being bonded by solid-phase diffusion bonding at 100° C. or lower.

3. The display module according to claim 1, wherein
the display is provided with a first board on the mounting board, and a second board on the first board,
the first board is provided with a first semiconductor substrate, and a drive circuit on the first semiconductor substrate, and
the second board is provided with a second semiconductor substrate, and a display element on the second semiconductor substrate.

4. The display module according to claim 3, wherein
the display element is an organic EL element, a liquid crystal display element, or an LED element.

5. The display module according to claim 3, wherein
the first semiconductor substrate and the second semiconductor substrate are directly bonded.

6. The display module according to claim 3, wherein
the first board is provided with a first connection terminal including copper,
the second board is provided with a second connection terminal including copper, and
the first connection terminal and the second connection terminal are directly bonded.

7. The display module according to claim 1, wherein the mounting board is provided with a connector, and the connector is on a surface on a side opposite to a side of the display.

8. The display module according to claim 1, wherein
the mounting board is provided with a land grid array (LGA), and the LGA is on a surface on a side opposite to the display.

9. The display module according to claim 1, wherein
the mounting board is a printed circuit board.

10. The display module according to claim 1, wherein
the mounting board is a rigid flexible printed circuit board.

11. The display module according to claim 1, further comprising:
an underfill, wherein the underfill is between the mounting board and the display.

12. An electronic device, comprising:
the display module according to claim 1.

* * * * *